(12) United States Patent
Vassiliev et al.

(10) Patent No.: US 6,500,771 B1
(45) Date of Patent: Dec. 31, 2002

(54) METHOD OF HIGH-DENSITY PLASMA BORON-CONTAINING SILICATE GLASS FILM DEPOSITION

(75) Inventors: Vladislav Vassiliev, Singapore (SG); John Leonard Sudijono, Singapore (SG); Alan Cuthbertson, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/494,635

(22) Filed: Jan. 31, 2000

(51) Int. Cl.$^7$ .............................................. H01L 21/31
(52) U.S. Cl. ......................... 438/783; 438/760; 438/778
(58) Field of Search ................................ 65/60.1, 60.2; 427/535; 438/783, 758, 760, 778, 787

(56) References Cited

U.S. PATENT DOCUMENTS

| | | | |
|---|---|---|---|
| 5,776,834 A | 7/1998 | Avanzino et al. | 438/692 |
| 5,899,736 A | 5/1999 | Weigand et al. | 438/601 |
| 5,976,993 A | 11/1999 | Ravi et al. | 438/788 |
| 6,030,881 A | * 2/2000 | Papasouliotis et al. | 438/424 |
| 6,037,018 A | * 3/2000 | Jang et al. | 427/579 |
| 6,200,412 B1 | * 3/2001 | Kilgore et al. | 156/345 |
| 6,211,040 B1 | * 4/2001 | Liu et al. | 438/424 |
| 6,316,330 B1 | * 11/2001 | Yang et al. | 438/424 |

OTHER PUBLICATIONS

S. Wolf et al., Siicon Processing for the VLSI Era, vol. 1, 1986, pp. 164 and 181.*
Conti et al., "Processing Methods To Fill High Aspect Ratio Gaps Without Premature Constriction", Proceedings for Fifth Dielectrics for ULSI Multilevel Int. Conf. (DUMIC), 1999, pp. 201–209.*
V. Vassiliev et al., "Properties and Gap–Fill Capability of HDP–PSG Films for 0.18um Device Applications and Beyond," Proceedings of Fifth Dielectrics for ULSI Multi-level Int. Conf. (DUMIC), (1999), p. 235.

Richard Conti et al., "Processing Methods to Fill High Aspect Ratio Gaps Without Premature Constriction," Proceedings of Fifth Dielectrics for ULSI Multilevel Int. Conf. (DUMIC), (1999), p. 201.

Jiro Yota et al., "Extendability of ICP High–Density Plasma CVD for Use as Intermetal Dielectric and Passivation Layers for 0.18um Technology," Proceedings of Fifth Dielectrics for ULSI Multilevel Int. Conf. (DUMIC), (1999), p. 71.

* cited by examiner

*Primary Examiner*—Michael Sherry
*Assistant Examiner*—Scott Geyer
(74) *Attorney, Agent, or Firm*—George O. Saile; Rosemary L. S. Pike (57) ABSTRACT

A method for fabricating a boron-contained silicate glass layers, such as borosilicate and borophosphosilicate glass films at low temperature using High Density Plasma CVD with silane derivatives as a source of silicon, boron and phosphorus compounds as a doping compounds, oxygen is described. RF plasma with certain plasma density is maintained throughout the entire deposition step in reactor chamber. Key feature of the invention's process is a flow capability of boron-contained silicate glass materials which provide a film with good film integrity and void-free gap-fill within the steps of device structures after low temperature thermal budget anneal conditions.

10 Claims, 7 Drawing Sheets

METHOD OF HIGH-DENSITY PLASMA BORON-CONTAINING SILICATE GLASS FILM DEPOSITION

BACKGROUND OF THE INVENTION

1. Field of the Invention

This invention relates generally to fabrication of semiconductor devices and more particularly to the fabrication of flowable boron-contained silicon glass films by using a High Density Plasma Chemical Vapor Deposition (HDP-CVD) technique with gas mixtures containing silane or its derivatives, necessary doping precursors, and oxygen.

2. Description of the Prior Art

In the fabrication of devices such as semiconductor devices, a variety of material layers are sequentially formed and processed on the substrate. For the purpose of this disclosure, the substrate includes a bulk material such as semiconductor, e.g., silicon, body, and if present, various regions of materials such as dielectric materials, conducting materials, metallic materials, and/or semiconductor materials. One of the material regions utilized in this fabrication procedure includes silicon oxide based materials, i.e., materials generally represented by the common formula $SiO_n$, where n=~2, including doped silicon oxide films, containing an additional doping element such as boron, phosphorus, and their mixtures, as well as fluorine, with total dopant content depending on the purpose of film application in the device. Below the common term "silicate glass film" is used to characterize silicate glass films.

In ULSI device technology, thin films, including silicon dioxide based films, are created on the substrates using a Chemical Vapor Deposition (CVD) technique that assumes a deposition of the solid state material (glass) on the hot substrate from the gas mixture of precursors and oxidizer. It is realized at different conditions, basically at atmospheric pressure (APCVD), low pressure (LPCVD), subatmospheric pressure (SACVD) reduced pressure, and with plasma excitation of gas mixtures (PECVD). A variety of silicon compounds and doping precursors have been used for film deposition. However, most common compounds are hydrides such as silane, fluorinated silane derivatives, phosphine, diborane, tetraethylortosilicate (TEOS), organic ethers of boric and phosphoric acids such as methylphosphates, ethylborates, etc. Oxygen has been commonly used as an oxidizer until recently when its mixture with ozone has been found to improve deposition process characteristics. Normally, film deposition during this process takes place with a constant deposition rate in the range of 0.1–10 KÅ per minute depending on the method used and its particular conditions.

Figure 1:
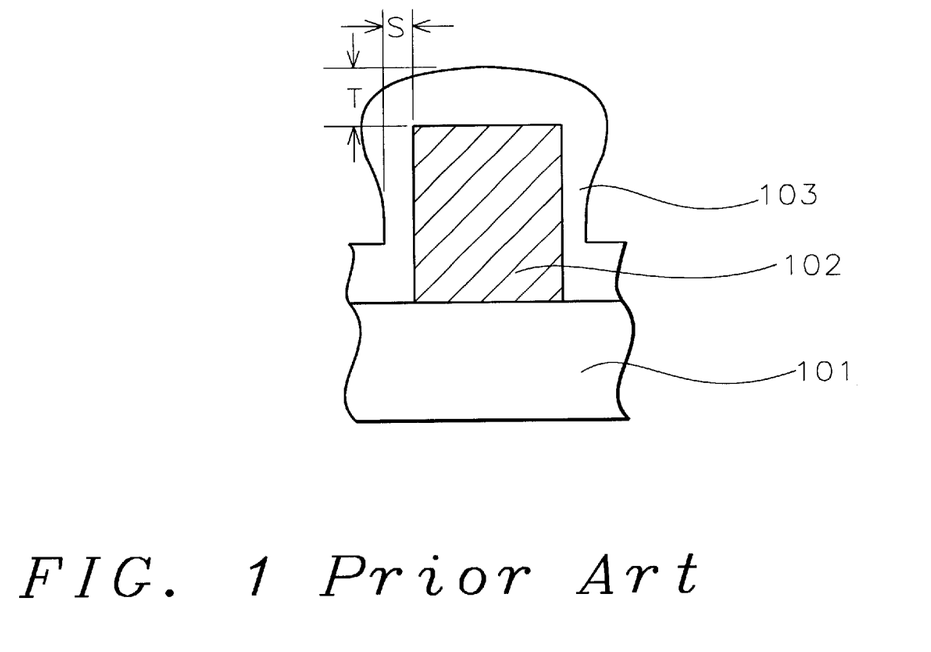
FIG. 1 is a simplified cross-sectional scheme of a conventional step coverage of chemically vapor deposited film on a device step.

A silicate glass film is often deposited on a substrate 101 (FIG. 1) having a plurality of steps, e.g., conducting steps. A feature of CVD processes is a non-conformal step coverage of growing film 103 on the step 102 on the device substrate 101 that schematically shown in FIG. 1, namely the film thickness on the top of structure is always higher as compared to the bottom and side wall thickness. Step coverage is normally expressed as a ratio of film thickness on the structure side wall "S" to the thickness on the structure top "T", as shown in FIG. 1. This ratio is different for different deposition processes as well as for current structures and is in the range of 15–90%.

Figure 2:
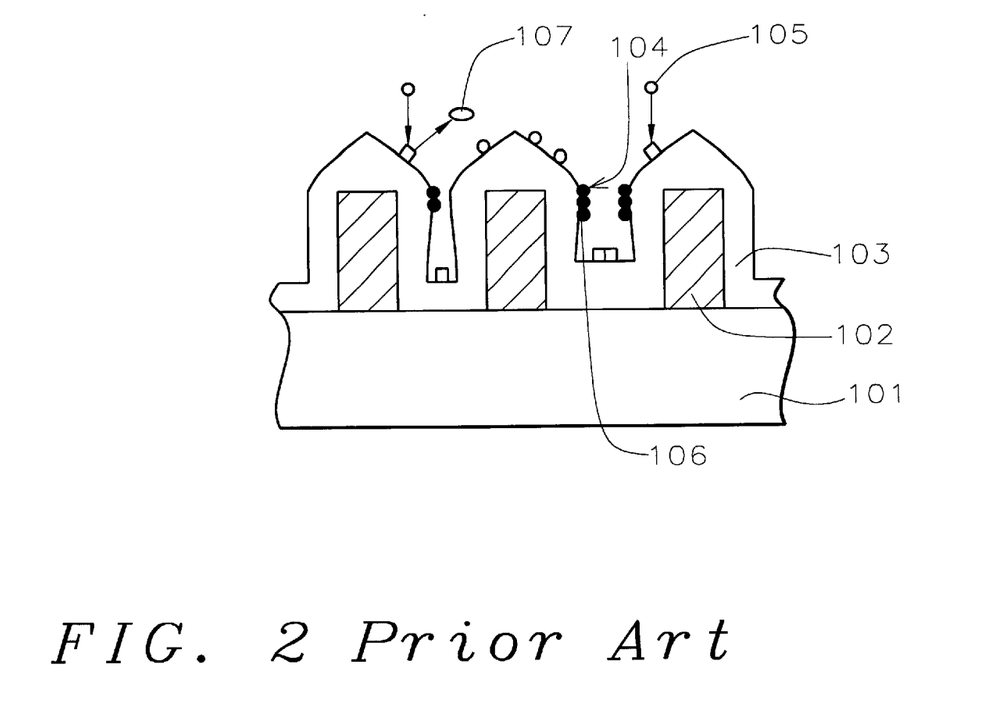
FIG. 2 is a simplified scheme of conventional HDP-CVD film growth.

Among other techniques used in semiconductor processing, silicon oxide based films (including fluorosilicate and phosphosilicate glass films) have been deposited during the last few years using a modified Plasma Enhanced Chemical Vapor Deposition (PECVD) called a High Density Plasma Chemical Vapor Deposition (HDP-CVD) technique. This technique assumes simultaneous deposition and sputtering of depositing films in order to improve gap-fill capability, as shown schematically in FIG. 2. FIG. 2 shows steps 102 formed on a semiconductor substrate 101. The silicon oxide or silicon glass film 103 is deposited over the steps 102. Material species are shown 104 on the surface of the film. Ionized Ar molecules 105 bombard the surface of the film resulting in sputtered and redeposited material 106 and vaporized material species 107. The method of chemical vapor deposition of silicon oxide and doped silicon glass films at High Density Plasma conditions (HDP-CVD) with silane-oxygen based gas mixtures is used in semiconductor manufacturing mostly for sub-quarter micron Ultra Large Scale Integrated (ULSI) circuit device applications. This method is used for deposition of silicon oxide, or frequently known as undoped silicon glass (USG), phosphosilicate glass (PSG), fluorosilicate glass (FSG), i.e. films which typically should not be subjected to thermal treatment at elevated temperatures. In the case of doped films, the dopant precursor, such as phosphine $PH_3$, for example, is added to the silane-oxygen mixture. Also, organic/inorganic silane derivatives, such as tetrafluorosilane $SiF_4$ or difluorosilane $SiH_2F_2$ are used either alone or in a mixture with silane.

Figure 3A:
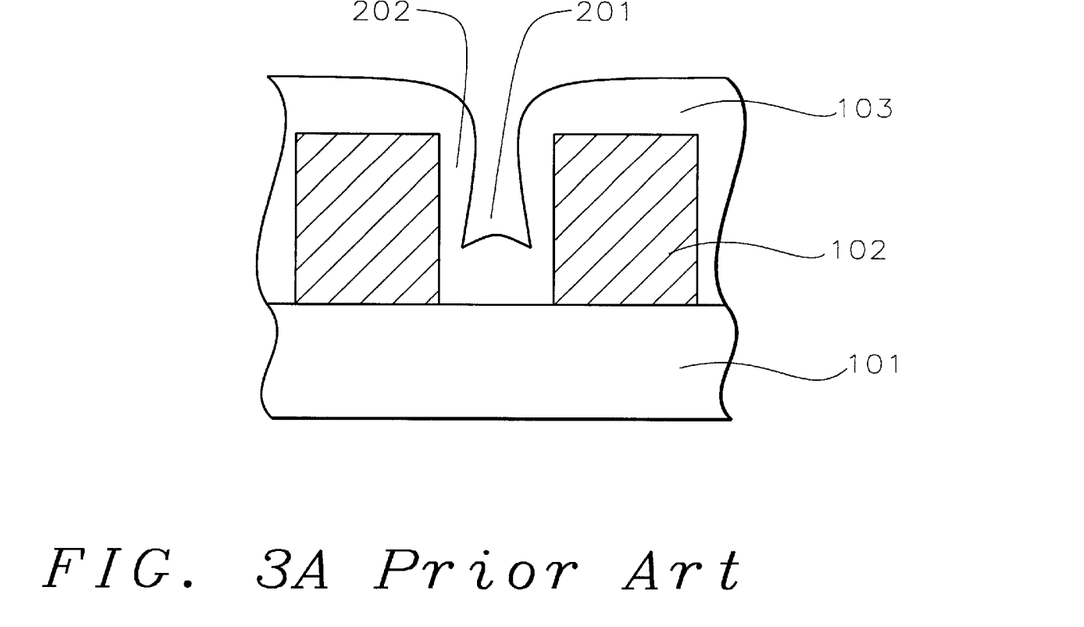
FIGS. 3A and 3B are cross-sectional views illustrating a void formation process at CVD conditions.
Figure 3B:
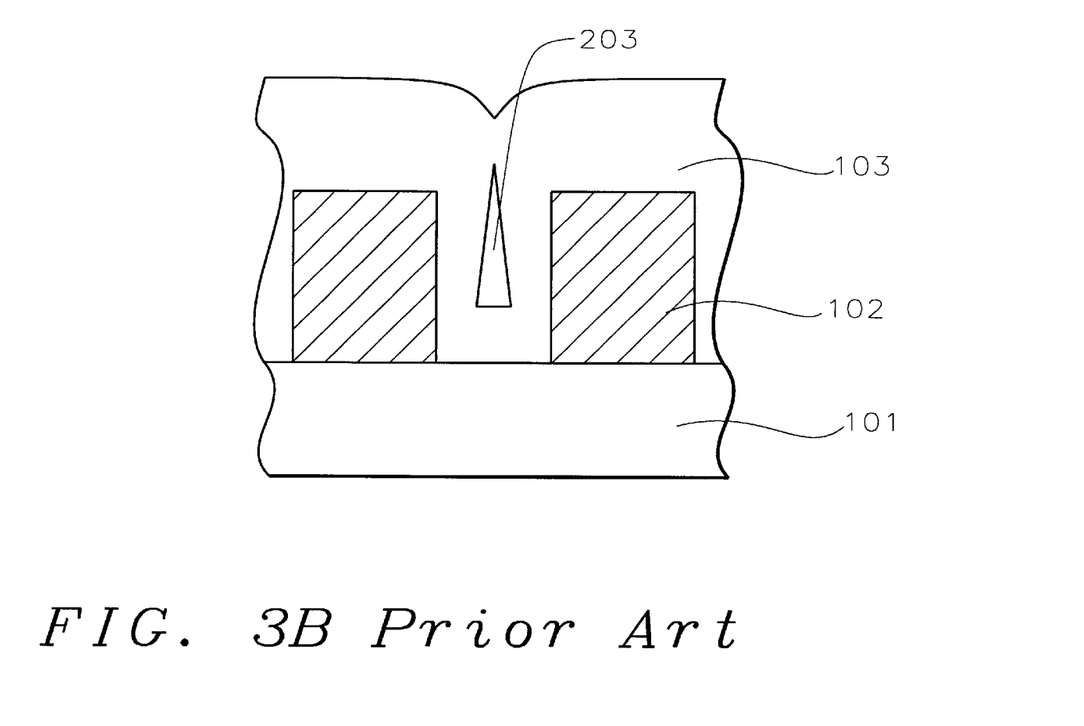

Silicate glass regions are utilized as insulating/passivating layers, as an electrical insulation between conducting layers, e.g., polysilicon or metal layers. Films of undoped silicon oxide are used also as a liner or as a cap layer either under or on the doped silicon oxide layers, respectively, to limit unacceptable dopant migration during subsequent processing. Tightening of device design rules leads to more complicated device structures with small gaps 201 (FIG. 3A) between neighboring elements. As a result of CVD non-conformal film growth on the top, side walls and bottom of such device structures that are shown schematically as a thinner film on the structure side wall 202 as compared to that thickness on the top of structure (this is due to the deposition kinetic features and diffusion limitation in small gaps), voids 203 (FIG. 3B) form inside structure elements. These voids have normally a keyhole shape that is valid for CVD methods for all current types of films. The voids are more or less pronounced depending on particular deposition conditions.

Figure 4A:
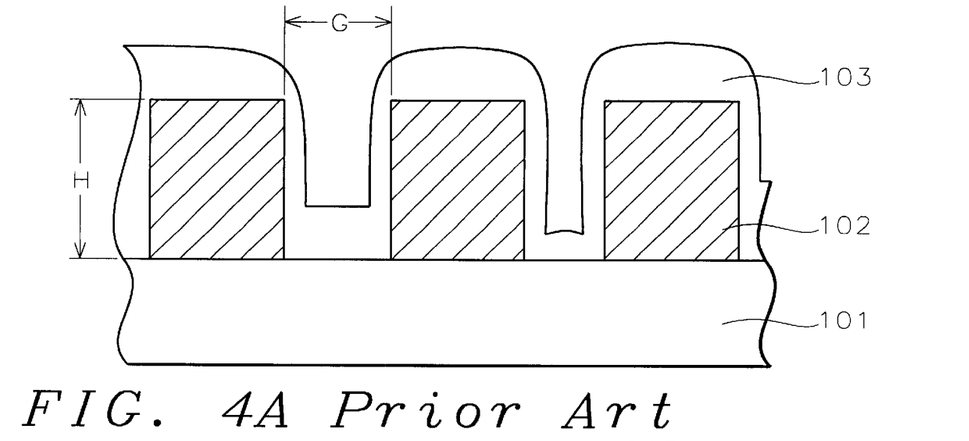
FIGS. 4A, 4B and 4C are cross-sectional schemes illustrating types of non-conformal step coverage at LPCVD, APCVD, and PECVD conditions, respectively.
Figure 4B:
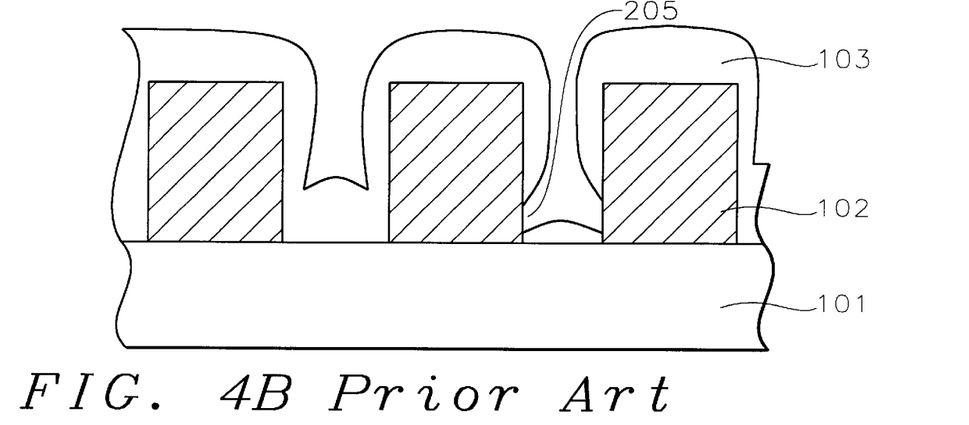
Figure 4C:
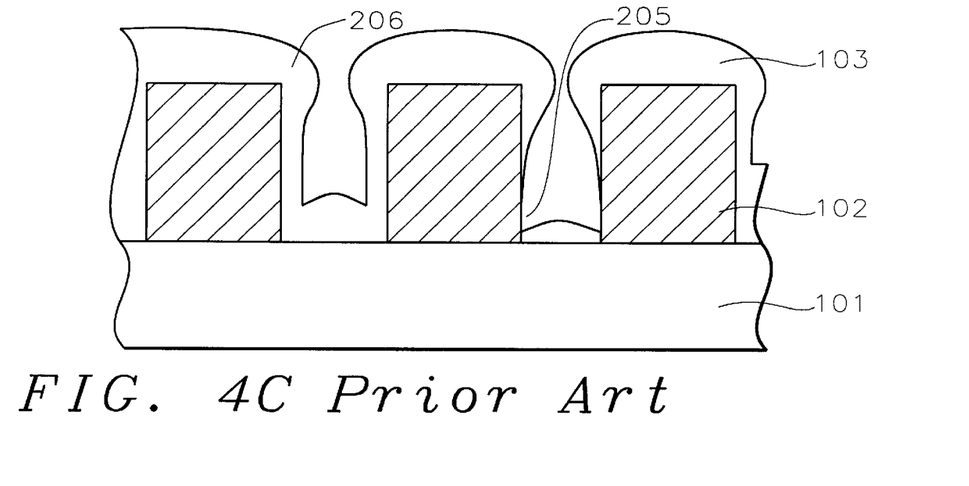

The reason for void formation is a common non-conformal glass film growth during film deposition that is shown schematically in FIG. 4A–C for different deposition techniques currently used in device manufacturing, such as LPCVD (FIG. 4A), APCVD (FIG. 4B), and PECVD (FIG. 4C). As can be seen in FIG. 4A, reduced pressure provides normally better step coverage, however, it normally means a lower deposition rate. Atmospheric pressure at certain conditions can cause even imperfection of film integrity in the bottom corners of structures 205, as shown in FIG. 4B. The last technique, being a part of HDP-CVD technique, provides the worst known case of step coverage, mostly below 50% even for single device steps, as well as imperfection of film integrity in the bottom corners 205 and the very specific "bread-loaf" shape of the growing film 206, as shown in FIG. 4C.

Figure 5:
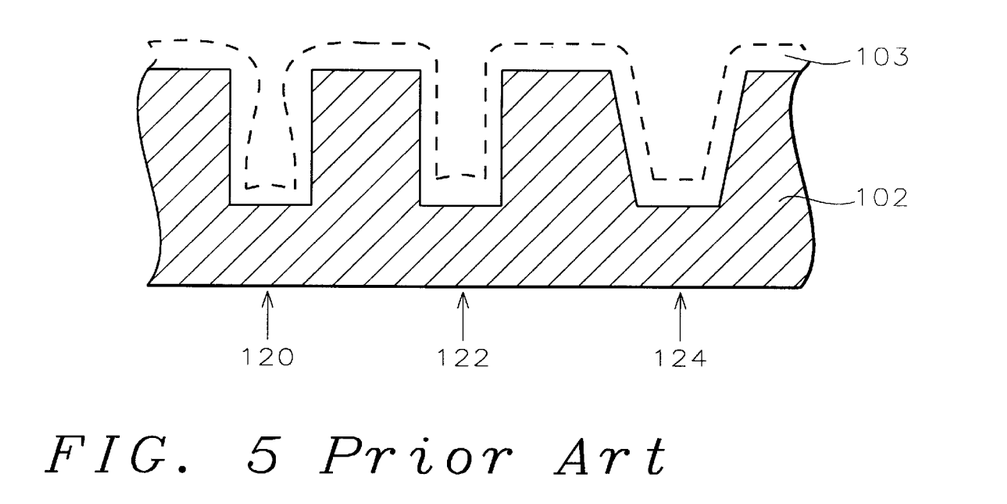
FIG. 5 is a cross-sectional scheme of film step coverage for device structures with different gap shape.

Among the CVD.process features, void size is strongly dependent on the structure parameters, such as structure shape, size of gaps between device elements (G) and structure height (H) which are normally combined to express structure complexity as an aspect ratio (AR=H/G), as shown as an example in FIG. 4A. To characterize an ability of film to fill narrow gaps between device elements, a term "gap-fill capability" is normally used and structures without any imperfection between device elements seen in cross-section of real structures using scanning electron microscopy techniques, are normally called "void-free". The void problem is significantly affected by structure shape being much more pronounced for structures with re-entrant gap shape, as shown schematically in terms of step coverage in FIG. 5 followed by the structure with vertical side walls. The best void-free gap-fill is normally achieved with structure tapering, however this approach is not applicable for all devices. FIG. 5 shows a re-entrant gap shape 120, a vertical gap shape 122, and a tapered gap shape 124.

The problem of film integrity and void formation at HDP-CVD processes (below the common term "voids" is used for both types of film structure imperfection) in different types of as-deposited HDP-CVD films have been found and analyzed recently, see for instance: [Ref.1]: R. Conti, L. Economikos, G. D. Parasouliotis, et al. "Processing Methods to Fill High Aspect Ratio Gaps Without Premature Construction," Proceedings of Fifth Dielectrics for ULSI Multilevel Int.Conf. (DUMIC), (1999), p. 201 and [Ref.2]: J. Yota, A. Joshi, C. Nguyen et al. "Extendibility of ICP High-Density Plasma CVD for Use as Intermetal dielectric and Passivation Layers for 0.18 um Technology," Proceedings of Fifth Dielectrics for ULSI Multilevel Int.Conf. (DUMIC), (1999), p.71.

Figure 6A:
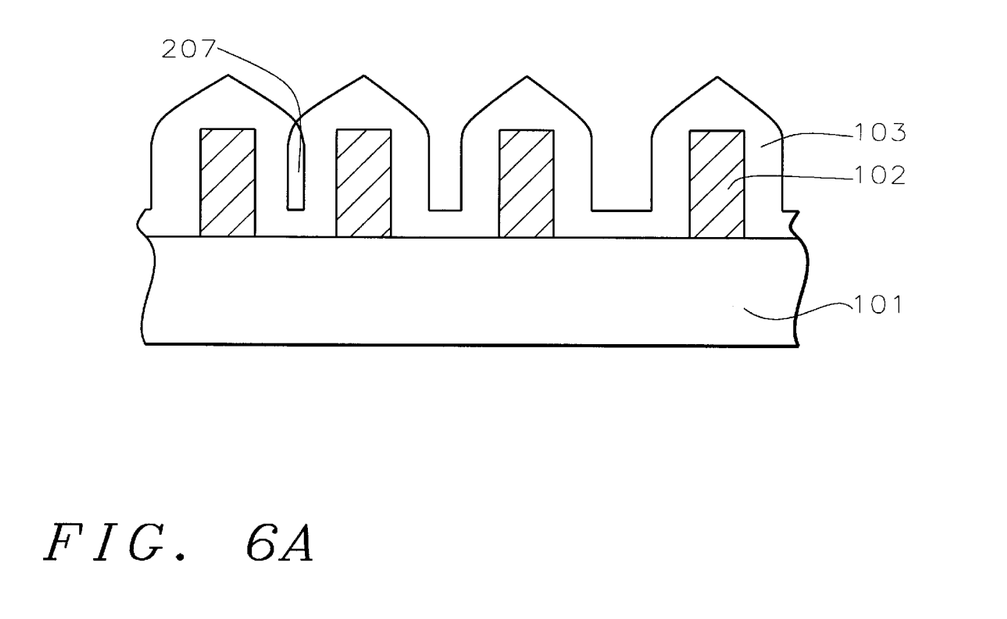
FIGS. 6A, 6B, and 6C are cross-sectional schemes illustrating in progress a void and a seam formation at HDP-CVD conditions.
Figure 6B:
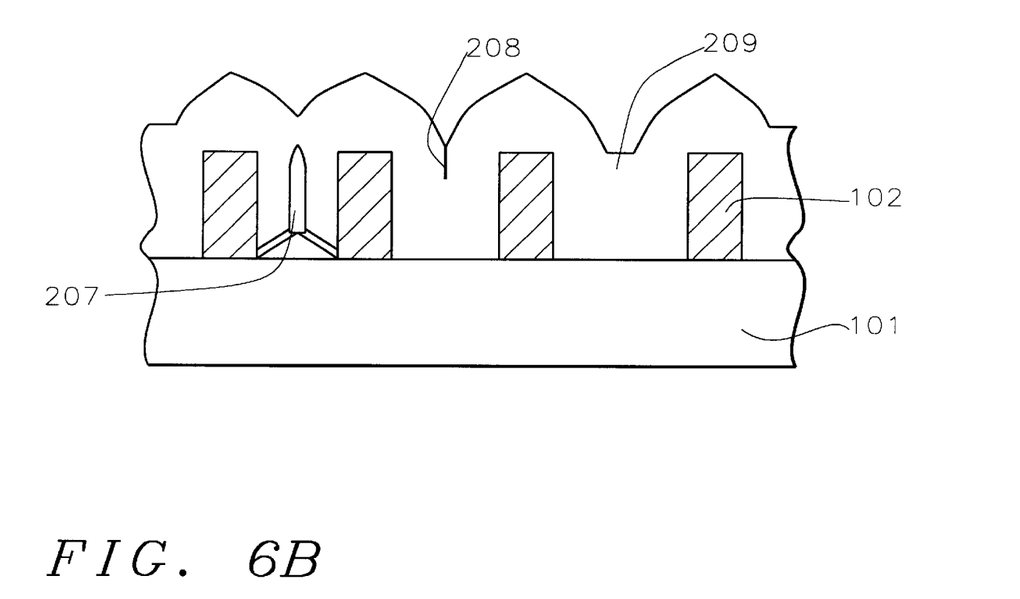
Figure 6C:
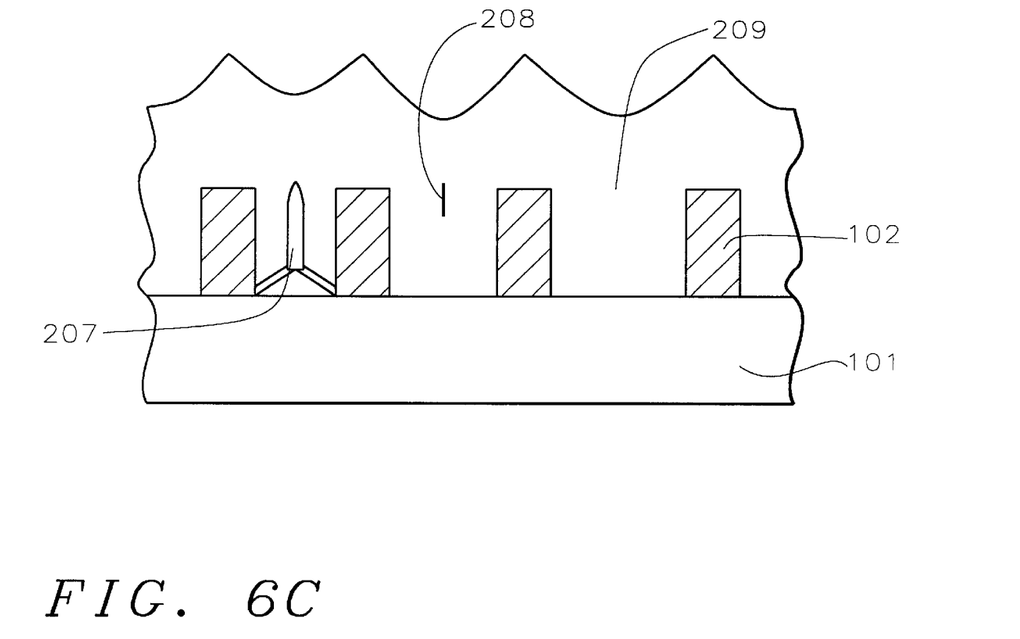

The reason for void formation under HDP-CVD conditions is normally explained as a result of redeposition of the film on the nearest surfaces caused by etch/sputtering of the film with argon bombardment from the top edges of structure steps, as shown in FIG. 2. This effect is shown in progress in FIG. 6. Continuous deposition with etch/sputtering causes the formation of film 103 on the steps 102 (shown in FIG. 6A), followed by void nucleation and formation 207 at the smallest spacings, as shown in FIG. 6B and FIG. 6C, followed by thin seam formation at the certain critical spacing ($G_{critical}$) and critical aspect ratios ($AR_{critical}$) 208. At the same time, a void-free film forms at a certain gap spacing, which is larger than critical, and aspect ratio, which is less than critical, as shown in FIG. 2B, 209, that eventually leads to the void-free gap-fill when the full film thickness is achieved, as shown in FIG. 6C.

Detailed analysis of HDP-CVD gap-fill capability for an example of structures with vertical side wall steps, mostly desired for ULSI applications, has been performed in [Ref.3]: V. Vassillev, C. Lin, D. Fung et al. "Properties and Gap fill Capability of HDP-PSG Films for 0.18 um Device Applications and Beyond," Proceedings of Fifth Dielectrics for ULSI Multilevel Int.Conf. (DUMIC), (1999), p.235, for he above mentioned film types and two main ranges of the HDP-CVD deposition temperature, namely, less than about 400° C and higher than about 500° C. Eventually, HDP-CVD gap-fill capability limitations for the commonly used deposition conditions can be quantitatively described by a simple equation (1):

$$AR_{critical} \leq k \times G_{critical}, \quad (1)$$

where the values of coefficient k have been found to be about 13.3 $\mu m^{-1}$ and 20.1 $\mu m^{-1}$ for high and low temperature processes, respectively. To reduce void formation effects in HDP-CVD, e.g. to enhance gap-fill capability of the HDP-CVD technique, the following approaches have been considered recently:

a) a decrease of the etch (sputtering) component to deposition ratio (below "E/D ratio") and decrease of process pressure. This helps to reduce an impact of film sputtering and, therefore, re-deposition. However, these measures cause an undesirable decrease of HDP-CVD process productivity as well as a necessity to enhance pump productivity.

b) structure rounding, as described in [Ref. 3]. In fact, such rounding allows much better HDP-CVD gap-fill capability using the same process conditions, including pressure, power, and etch to deposition ratio. However, this approach is not applicable for all ULSI device structure elements.

Thus, for device structures with vertical side walls the following common numbers of void-free as-deposited film gap-fill capability with different deposition techniques have been found, as shown in the Table 1, together with typical gap-fill requirements of sub-quarter micron ULSI logic device application. It is clear that all currently used methods do not allow achievement of void-free structures with tight parameters, which is known to be getting even tighter with further device development.

TABLE 1

| Structure parameter | Needs for PMD application in ULSI | Value of parameter after film deposition | | |
|---|---|---|---|---|
| | | LPCVD/APCVD | PECVD | HDP-CVD |
| Critical gap ($\mu m$) | <0.05 | >0.35 | >0.5 | >0.15–0.16 |
| Critical aspect ratios | >4 | <1–1.2 | <~1 | <3.1–3.3 |

Figure 7A:
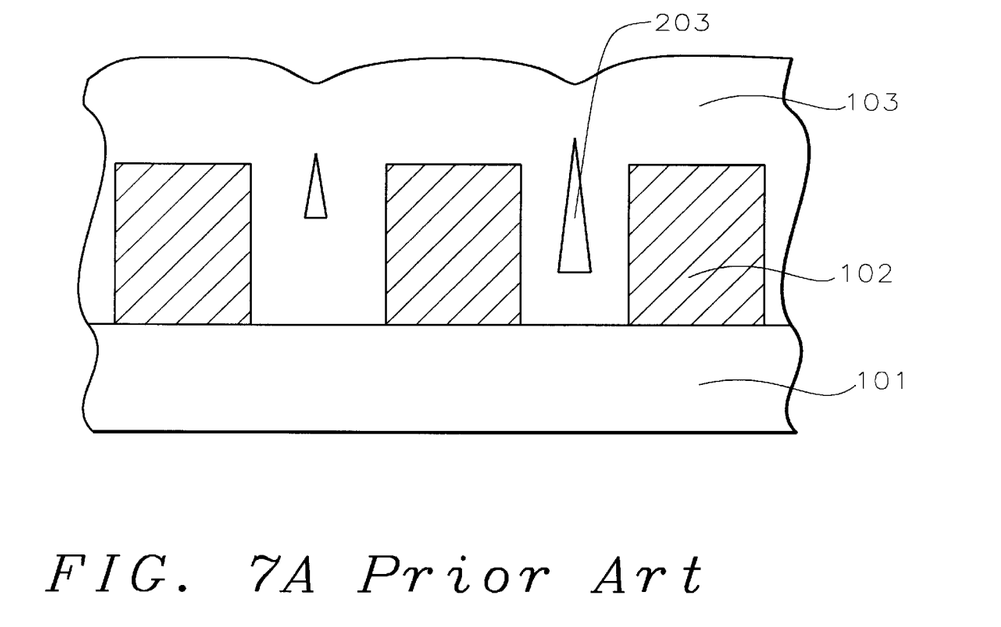
FIGS. 7A and 7B are cross-sectional schemes illustrating as-deposited and thermally flowed BPSG film having round void after thermal treatment.

One of the major intrinsic properties of glasses, including silicon-based glasses, is an ability to soften, or to flow at enhanced temperatures. Applying this phenomenon to ULSI device application, it allows a planarization of a non-planar device surface (see FIG. 7A) using a thermal treatment of a non-planar as-deposited glass film which is able to soften at elevated temperatures above the temperature of its softening to form a planar film surface, as shown schematically in FIG. 7B. In semiconductor manufacturing, mostly in ULSI device technology, just a few options of silicate glasses have been used, mostly phosphosilicate and borophosphosilicate glasses (PSG and BPSG). Along with the surface planarization at elevated temperatures, film softening at elevated temperatures allows elimination of voids. Most effective for void elimination are high temperatures providing significant lowering of glass viscosity. Shape of gaps is also very important for the gap-fill after thermal treatment: the best gap-fill can be achieved with tapered device structures that generally shows a trend that better as-deposited gap-fill leads to the best gap-fill after any comparable thermal treatment.

Figure 7B:
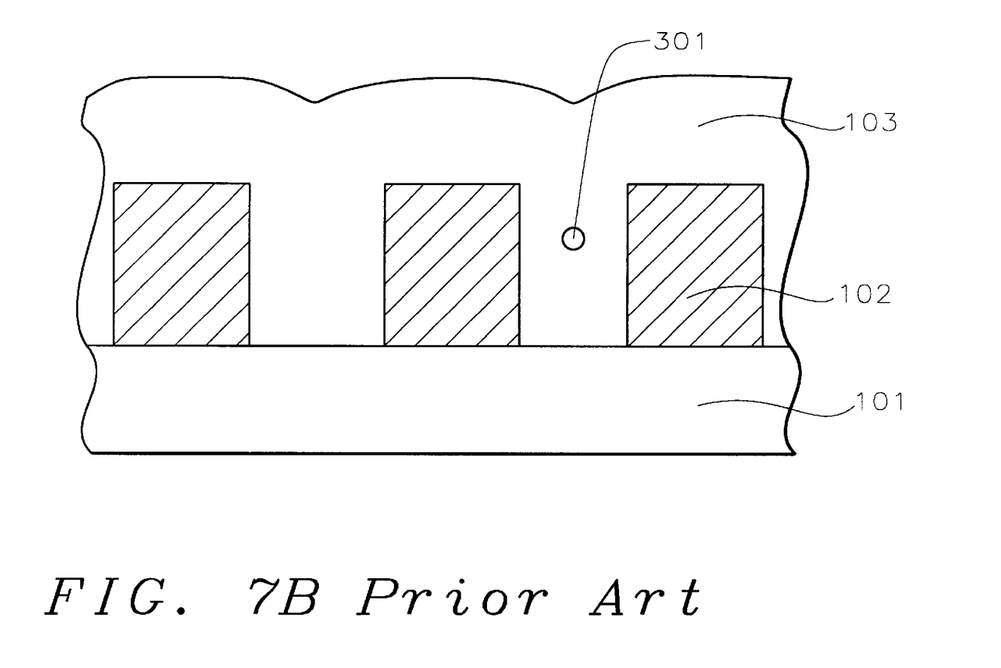

Thermal anneal conditions are very important for ULSI technology. Development of silicide-based gates in the latest ULSI devices with sub-quarter micron design rules has enhanced a necessity to lower the post silicide thermal budget to lower than about 800° C. Such a low temperature is not sufficient enough to provide required glass softening and as a result of this, low thermal budget anneal conditions, such as low isothermal furnace anneal, or rapid thermal anneal at temperatures less than 800° C., does not provide sufficient film flow. Thus, a problem of voids 301 in thermally treated silicate glass films, as shown in FIG. 7B, in device structures has arisen in device generations with design rules less than about 0.25 $\mu m$, and, especially, in devices with less than 0.18 $\mu m$ design rules. Voids are undesirable because etching and dielectric properties will be non-uniform.

Phosphorus-contained films with very high phosphorus concentrations of about 10 wt. % are capable of flowing at temperatures above 1000° C., but that temperature is not acceptable for modern device applications and beyond. Thus, the latest HDP-CVD PSG films are supposed to not flow at the low thermal budget conditions. Due to the low thermal budget requirements, boron-contained films, such as BPSG films, are considered to be more preferable for ULSI technology that is due to the effective decrease of softening temperature with the boron doping as compared to that of phosphorus. However, boron-contained BPSG films deposited at current APCVD, RPCVD and PECVD conditions do not allow sufficient enough as-deposited film gap-fill capability and, therefore, post thermal treatment gap-fill capability at low thermal budget conditions.

Thus, voids in device structures are not acceptable because of a worsening of device reliability. Therefore, it is very desirable to produce a good HDP-CVD film integrity and gap-fill capability. The prior art processes do not provide a silicon oxide layer that can satisfactorily fill gaps between the increasingly tight step features of new ULSI semiconductor devices without forming voids in between the conductor lines. Therefore, it is very desirable to produce glass films without any imperfection, such as voids inside dielectric material.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

U.S. Pat. No. 5,899,736 to Weigand et al teaches a phosphorus-doped HDP-CVD oxide film. U.S. Pat. No. 5,976,993 to Ravi et al teaches HDP-CVD silicon dioxide with reduced stress using biasing during deposition. U.S Pat. No. 5,776,834 to Avanzino et al teaches HDP-CVD silicon dioxide over a conformal TEOS layer where a void is purposefully created within the silicon dioxide layer in small gaps.

SUMMARY OF THE INVENTION

It is an object of the present invention to provide a method for fabrication of flowable boron-contained silicon class films by using a High Density Plasma Chemical Vapor Deposition (HDP-CVD) technique with gas mixtures containing silane or its derivatives, necessary doping precursors, and oxygen.

It is an object of the present invention to provide a method for fabricating a flowable boron-contained silicon class layer over a stepped substrate surface using HDP-CVD process that produces good integrity of film along the device steps and void-free structures. The invention's "boron-contained HDP-CVD glass film" process and preferred Invention's process conditions are shown below n Table 2. The most critical parameters in the invention are dopants to silicon source mole ratio, sputtering to deposition ratio, and total pressure.

The invention has the following advantages: much better as compared to other deposition techniques: as deposited gap-fill capability at commonly used deposition conditions, such as process pressure, etch to deposition ratio, relatively high deposition rate and process productivity, good film quality, and very good film gap-fill after film thermal treatment at elevated temperatures. Besides, it is simply realized and there is no need to change chamber design.

The present invention achieves these benefits in the context of known process technology. However, a further understanding of the nature and advantages of the present invention may be realized by the reference to the latter portions of the specification and attached drawings.

TABLE 2

| Process parameter | Estimated range of parameters for Invention's "boron-contained HDP-CVD glass film" | An example of preferred set of parameters |
| --- | --- | --- |
| Wafer temperature (° C.) | 250–650 | 400–650 |
| Pressure (millitor) | 0.5–10 | 1–5 |
| Plasma frequency (KHz) | 300–600 | 400–450 |
| Plasma density (ion/cm$^2$) | 1 × E11–1 × E13 | 1 × E11–1 × E12 |
| Etch to deposition ratio | 0.03–0.3 | 0.05–0.15 |
| Silicon source | Silane and its derivatives | Silane |
| Silicon source flow (sccm) | 50–500 | 100–200 |
| Oxygen flow (sccm) | 100–400 | 250–350 |
| Dopant compounds | Diborane and its derivatives Phosphine and its derivatrives | Diborane and its derivatives Phosphine and its derivatrives |
| Dopant gas flows | Must be chosen based on desirable dopant concentration | Must be chosen based on desirable dopant concentration |
| Boron precursor flow rate (sccm) | 10–150 | 20–100 |
| Phosphorus precursor flow rate (sccm) | 10–150 | 20–100 |
| Carrier gas | Ar, He | Ar, He |
| Carrier gas flow (sccm) | 20–400 | 50–100 |

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and in which.

DETAILED DESCRIPTION OF THE PREFERRED EMBODIMENTS

The present invention will be described in detail with reference to the accompanying drawings. In the following description numerous specific details are set forth such as flow rates, pressure settings, thickness, etc, in order to provide a more thorough understanding of the present invention. It will be obvious, however to one skilled in the art that the present invention may be practiced without these details. In other instances, well known processes have not been described in detail in order to not unnecessarily obscure the present invention. Also, the flow rates in the specification can be scaled up or down keeping the same molar % or ratios to accommodate differently sized reactors as is known to those skilled in the art.

A. Measurement of Oxide Layer Conformance

Conformance can be measured in several ways. In the case of a rectangular shape of conducting lines in section, as shown in FIG. 1, the ratio between dimension "S" and dimension "T", which is the same on the top of the line and on the open substrate surface, can be used. In the real and more complicated case of non-rectangular shape of conducting lines in section, more complicated approaches for the conformance characterization have to be used. However, a use of thinnest film value in most cases can be sufficient enough for the comparison of different methods on similar device structures.

B. Observation of Voids in CVD Films

Normally, voids can be observed using cross sectional scanning electron microscopy analysis of device structures with as-deposited or thermally annealed films. Film imperfection, such as bad film integrity and voids in different types of CVD films have been found to form in the bottom corners of as-deposited films, and in the center of the space between two nearest lines of a device, as shown in FIG. 3, FIG. 4, FIG. 6, and FIG. 7. The shape of voids is dependent on the film type and gap geometry, namely space between lines (G) and aspect ratios (AR), as shown in FIG. 4A. Aspect ratio is a certain characteristic which defines structure and it can be calculated by dividing the gap height by the gap space.

C. Problems of Conventional LPCVD, SACVD, APCVD, PECVD and HDP-CVD Processes The inventors have determined that previous silicate glass deposition techniques do not meet the changing requirements of new denser products. It is to be understood in this regard that no portion of the discussion below is admitted to be prior art as to the present invention. Rather, this highly simplified discussion is an effort to provide an improved understanding of the problems that are overcome by the invention.

There are three basic deposition techniques used for undoped silicon oxide and doped silicon glasses, including boron-contained silicon glasses: (1) low pressure (LPCVD) or reduced (subatmospheric) pressure (SACVD) chemical vapor deposition, (2) atmospheric pressure (APCVD) deposition, and (3) plasma-enhanced (PECVD) deposition. The general characteristics of all these methods are listed in the Table 3 below for the case of boron-contained silicate glass films with subsequent thermal anneal at elevated temperatures. Comparison of methods shows that all methods have obvious advantages and disadvantages that limit their usage in technology for devices with small features.

HDP-CVD deposition technique is used for undoped oxide deposition as well as low (below 4 wt. %) phosphorus-doped silicate glasses. These materials have better step coverage and gap-fill after deposition as compared to all methods cited above. However, these materials are not flowable even at very high temperatures of about 1000° C. That makes them non-applicable for void-free gap-fill employment in ULSI devices unless other approaches, such as structure tapering, are implemented.

TABLE 3

| Deposition method | Advantage | Disadvantage |
|---|---|---|
| LPCVD TEOS based BSG and BPSG films with subsequent anneal at elevated temperatures | 1. Good film properties because of high deposition temperature<br>2. No plasma damage<br>3. Sufficient enough dopant level | 1. High deposition temperature (high thermal budget) for modem device applications<br>2. Low deposition rate and process productivity<br>3. Not sufficient enough step coverage<br>4. Not sufficient enough as-deposited gap-fill capability as well as after thermal treatment (see Table 1) |
| SACVD/APCVD TEOS-ozone BSG and BPSG films with subsequent anneal at elevated temperatures | 1. Relatively high deposition rate and process productivity<br>2. No plasma damage<br>3. Sufficient enough dopant level | 1. There is a surface sensitivity effect for BSG films, e.g. different deposition rate on silicon, oxide and nitride which normally needs pre-deposition surface treatment or in-situ liner pre-deposition need to be used to suppress the surface sensitivity<br>2. Not sufficient enough step coverage<br>3. Not sufficient enough as-deposited gap-fill capability (see Table 1) as well as after thermal treatment<br>4. Poor film properties, such as moisture absorption, because of high film porosity<br>5. There is a strong correlation |

TABLE 3-continued

| Deposition method | Advantage | Disadvantage |
|---|---|---|
| | | between the deposition rate and the dopant concentration in doped SACVD films |
| Silane or TEOS based PECVD BSG and BPSG films with subsequent anneal at elevated temperatures | 1. No sensitivity of deposition process to surface<br>2. High deposition rate<br>3. Wide range of dopant concentrations<br>4. Good film properties, including moisture resistance, because of low film porosity<br>5. Power can be used to adjust film properties | 1. Deposition rate depends strongly on dopant to silicon source ratio<br>2. Very bad step coverage, especially for doped films<br>3. Bad film integrity along the step of conducting line<br>4. Bad as-deposited gap-fill (see Table 1) as well as after thermal treatment |
| HDP-CVD undoped silicon dioxide or PSG with subsequent anneal at elevated temperatures - prior art | 1. No sensitivity of deposition process to surface<br>2. Relatively high deposition rate<br>3. Wide range of phosphorus concentrations<br>3. Good film properties, including moisture resistance because of low film porosity<br>4. Power (expressed as E/D ratio) can be used to adjust film properties including gap-fill<br>5. Deposition rate does not depend on phosphine to silicon source ratio<br>6. Film step coverage does not depend on film doping | 1. Insufficient film integrity along the steps<br>2. Insufficient as-deposited film gap-fill<br>3. No film flow capability<br>4. Insufficient gap-fill after film anneal |
| Invention: Boron-contained HDP-CVD glass films: either BSG or BPSG with subsequent film anneal at elevated temperatures | 1. No sensitivity of deposition process to surface<br>2. Relatively high deposition rate<br>3. Wide range of dopant concentrations<br>3. Good film properties, including moisture resistance because of low film porosity<br>4. Power (expressed as E/D ratio) can be used to adjust film properties including gap-fill<br>5. Deposition rate does not depend on dopant to silicon source ratio<br>6. Film step coverage does not depend on film doping<br>7. Flow-able film<br>8. Good film integrity along the steps after film anneal<br>9. Improved gap-fill after film deposition<br>10. Good gap-fill after film anneal | |

The following conclusions can be drawn from the comparison of data fin Table 3: advantages of the prior art HDP-CVD process cannot be used because of bad film gap-fill capability. Advantages of this method, and more advantages of film gap-fill capability can be achieved using invention's "boron-contained HDP-CVD glass film".

To clarify prior art HDP-CVD process features, an analysis of major deposition problems is presented below in detail using a silane $SiH_4$, mostly used for HDP-CVD processes at present, as a typical silicon source representative of the present invention.

It is known that the chemical reaction of silane with oxygen can be realized in a wide range of temperatures (from room temperatures and above) to produce silicon oxide as either a powder or a film. This reaction is known to have a chain reaction mechanism, as simply presented below in scheme (1), with a formation of highly active intermediate products (IMP)-radicals followed by formation of a $SiO_2$ species in the gas phase. After that, gas-phase species diffuse to the surface followed by their adsorption and reaction to form a solid state film, as shown below:

$$\text{silane+oxygen} \rightarrow \text{IMP}_1 \rightarrow \ldots \rightarrow \text{IMP}_n \rightarrow \text{SiO}_2 \text{ (film)} \qquad (2)$$

This reaction is considered as a gas phase limited reaction, e.g. the relatively slowest stage of chemical reaction is a formation of intermediate compounds IMP. It is also known that plasma excitation of reaction mixtures also causes a formation of highly active intermediate radicals, especially at conditions used in a High Density Plasma deposition method. Thus, HDP-CVD deposition with silane or silane derivatives and oxygen generally goes in accordance with radical mechanisms. Eventually, Plasma Enhanced CVD (PECVD) using oxidation of silane with oxygen creates a specific "bread-loafing" profile of deposited film, as shown by 206 in FIG. 4C. This causes voids at spacing lower than about 0.5 micron and AR higher than about 1.

HDP-CVD method with simultaneous deposition and in-situ etch/sputtering of the growing film allows an improvement of film growth, making it very specific, as shown in FIG. 2. In fact, growing HDP-CVD film 103 on the steps 102 of a device on the substrate surface 101 has a specific shape due to the partial sputtering of the growing material species 104 by inert gas radicals 105. Growing material 104 can further be either re-deposited on the nearest surfaces of the neighbor step to form re-deposited film 106, or evaporated 107 and further to be pumped out of the reactor. Eventually, simultaneous etch/sputtering allows improvement of growing film on the top of structures and, therefore, an improvement of the HDP-CVD film gap-fill.

HDP-CVD technique has also gap-fill limitations, as shown in Table 1. This is because the etch/sputtering cannot fully compensate for the strongly non-conformal profile of the growing film. As a result, seams 208 and voids 207 are forming during HDP-CVD film deposition, as shown in FIGS. 6A–6C. Silicon dioxide and phosphosilicate glass films deposited using HDP-CVD conditions are not flowable at elevated temperatures required for ULSI device applications. This means that although these glass films show better as-deposited step coverage and gap-fill as compared to other deposition techniques, they cannot be used for device applications unless device structure modification is allowed, such as structure rounding and side wall tapering.

Thus, providing flow-capability of deposited silicate glass material is best as compared to other deposition technique step coverage and gap-fill of HDP-CVD growing film will lead to the improvement of overall film gap-fill capability for sub-quarter micron devices.

Invention's "Boron-contained HDP-CVD Glass Film"

In summary: the advantages of standard prior art HDP-CVD processes cannot be used because of bad gap-fill capability with the tightening of device geometry and because of worsening of deposition rate with the decrease of process pressure and etch to deposition ratios. The invention's "boron-contained HDP-CVD glass film" process covers advantages of the prior art method and provides further advantages of film properties.

A. Advantages of the Invention's "Boron-contained HDP-CVD Glass Film"

The invention has the following advantages: no sensitivity of deposition process to surface, relatively high deposition rate, wide range of dopant concentrations, good film properties, including moisture resistance because of low film porosity, power (expressed as E/D ratio) can be used to adjust film properties including gap-fill, deposition rate does not depend on dopant to silicon source ratio, film step coverage does not depend on film doping, flowable film, good film integrity along the steps after film anneal, good gap-fill after film anneal. Besides, it is simply realized and there is no need to change chamber design.

The invention's process can be performed in any High Density Plasma reactor providing necessary wafer heating and equipped with necessary RF-power assemblies, gas supply system and vacuum pumping system without any modification of reaction chamber design. For instance, it can be realized in the "Ultima" HDP-CVD reactor made by Applied Materials, Inc., or in "SPEED" HDP-CVD reactor created by Novellus's Inc., etc.

B. Application of Method of Invention's "Boron-contained HDP-CVD Glass Film"

The Invention's "boron-contained HDP-CVD glass film" process can be used to deposit low thermal budget flowable borosilicate glass (BSG) and borophosphosilicate glass (BPSG) dielectric layers.

C. Detailed Description of Invention's "Boron-contained HDP-CVD Glass Film"

This invention's "boron-contained HDP-CVD glass film" provides good as-deposited HDP-CVD gap-fill capability at relatively high process pressures and etch to deposition ratios, and relatively high deposition rate and process productivity. Detailed parameters of the invention's boron-contained HDP-CVD glass film process are shown in Table 2 shown above in the Summary section. The process parameters presented in Table 2 can be used for deposition of the silicon oxide that can be doped with boron and boron and phosphorus (BSG and BPSG films) using the Invention's "boron-contained HDP-CVD glass film" with boron and phosphorus derivatives, for example, such as diborane, phosphine, boron and phosphorus chlorides, organic ethers, etc. In this case, particular dopant precursor flows and ratios of boron and phosphorus derivatives to silicon source flow are chosen based on the required concentration of boron and phosphorus in the glass.

The most critical parameters in the invention are dopant to silicon source ratio, etch to deposition ratio, and process pressure.

In this invention, in order to improve overall film gap-fill an approach with boron-contained silicate glass is proposed. These boron-contained glass films, such as borosilicate (BSG) and borophosphosilicate (BPSG), being deposited with the best as compared to other know deposition technique as-deposited gap-fill, and being able to flow even at relatively low post-deposit thermal treatment, will lead to the decrease of voiding during deposition and after post-deposition thermal treatment. Moreover, introduction of boron-contained precursors in the silane-contained gas-phase during deposition causes a suppression of highly active radicals, eventually leading to an improvement of step coverage and gap-fill, see for instance: V. Vassiliev and T. G Duhanova, Electrochemical Society Proceeding Volume "Fundamental Gas-Phase and Surface Chemistry of Vapor-Phase Materials Synthesis", PV 98–23, p.p.258–263 (1998).

Figure 8A:
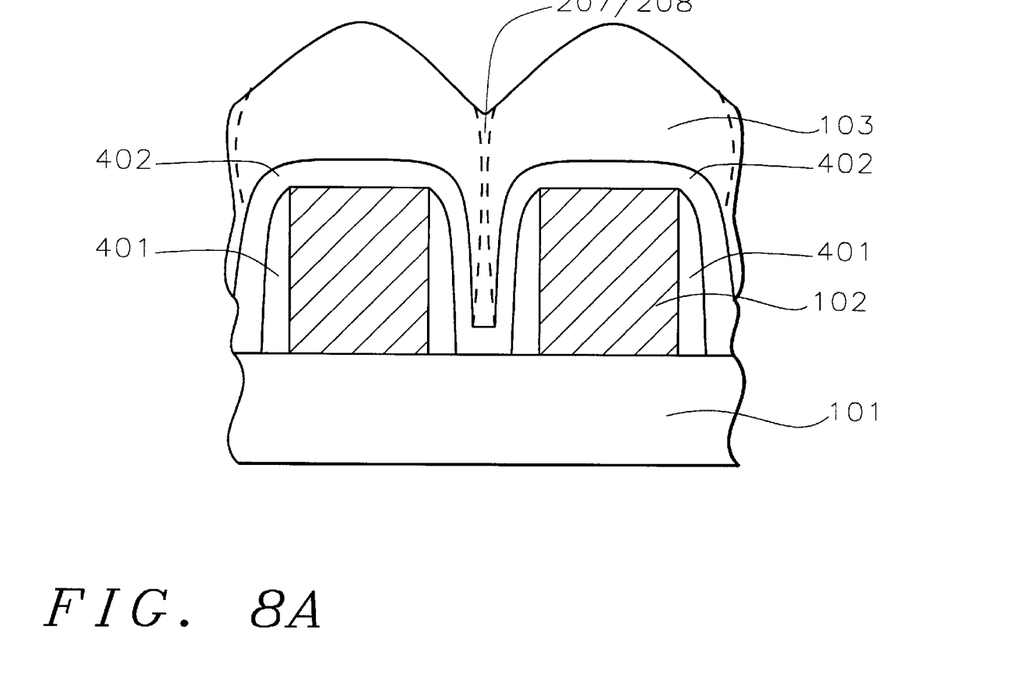
FIGS. 8A and 8B are cross-sectional views of boron-contained flow-able HDP-CVD films after deposition and film thermal treatment in accordance with the present invention.

The idea of the invention is clear from FIG. 8, where a typical scheme of device structure is presented. In this figure, device elements 102 are placed on the substrate 101. Spacers 401 required for junction formation are formed using deposition, lithography and etching techniques. These spacers, having normally the thickness of about 600–800Å, significantly decrease the spacing between elements making them narrow with vertical or slightly tapered side walls. Subsequent deposition of PECVD liner oxide or nitride film 402 (it is necessary to prevent any diffusion of dopants from doped films into the device, and in the case of nitride film, as etch stop layer as well) which normally has a thickness of 500–1000Å causes the further decrease of cap size. In such a case, liner oxide deposition with very bad step coverage as shown above, can change the profile of the gap and makes it re-entrant.

After that, a HDP-CVD boron-contained film 103 deposition will lead to the format on of a dense film with improved gap-fill which, however, will have little seams 208 at critical spacing, or little voids 207 at spacings less than critical. Subsequent boron-contained film post-deposition thermal treatment at elevated temperatures will cause the film softening and flow that will lead to the elimination of the little seams and voids in the film, as well as to the planarization of film surface due to the flow.

Figure 8B:
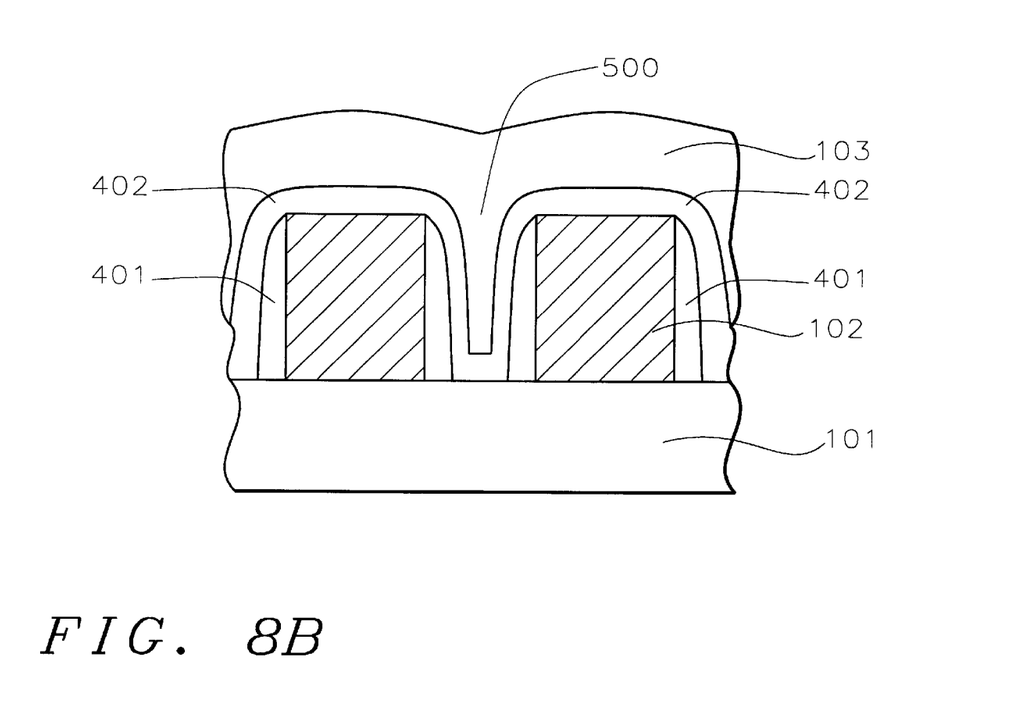

Eventually, post thermal treatment of boron-contained films will lead to the formation of void-free uniform film 500 in between even very small gaps, as shown in FIG. 8B. An improvement of gap-fill of as-deposited HDP-CVD boron-contained films allows lowering the thermal budget conditions for post-deposition film thermal treatment to achieve void-free film. As an example of such low thermal treatment conditions, a rapid thermal anneal (RTA) for 20 to 180 seconds at temperatures equal to or below 850° C. is implemented.

The post-deposition thermal treatment also causes a certain improvement of the total film quality because of high-density of the deposited film at HDP-CVD conditions that allows an improvement in moisture resistance of BSG films. Finally, the summary of important parameters of the invention's boron-contained HDP-CVD glass film process are presented in Table 4 below:

TABLE 4

| Parameter | Reason parameter is important |
| --- | --- |
| Dopant to silicon source ratio | An increase of the ratio of boron and phosphorus sources to silicon source causes an increase of a dopant concentration in the film, which is necessary to achieve desirable film flow capability at subsequent film anneal, especially at low thermal budget conditions. |
| Etch to deposition (E/D) ratio | The increase of E/D ratio leads to the increase of re-sputtering on device steps and, therefore, leads to worsening of step coverage on the top of step, e.i. leads to worsening of gap-fill capability for as-deposited HDP-CVD film and, eventually, for the film after thermal treatment. |
| Pressure | Lowering of the pressure allows achieving better film step coverage on device steps, an improvement of film integrity on the steps, as well as gap-fill. |

D. In-situ Liner/Cap Deposition Before/after "Boron-contained HDP-CVD Glass Film" Deposition The invention also provides the following preferred embodiment where a liner layer is formed under the boron-contained HDP-CVD glass film, and then without removing the substrate from the reactor, a silicon oxide layer is formed in-situ over the boron-contained HDP-CVD glass film.

E. In-situ PSG Cap Deposition After "Boron-contained HDP-CVD Glass Film" Deposition The invention also provides the following preferred embodiments where a phosphosilicate layer is formed over the boron-doped silicate glass film in-situ.

F. Differentiation of the Invention Over the Prior Art HDP-CVD Processes

The Table 5 below compares parameters for the invention's "boron-contained HDP-CVD glass film" with the prior art HDP-CVD PSG film and clearly shows the differences between the invention and the prior art processes. Both processes use the same HDP-CVD reaction chamber type.

As Table 5 shows, the most important parameters for the invention are: ratio of dopant to silicon source, etch to deposition ratio, and process pressure. It should be recognized that many publications describe the details of common techniques used in the fabrication process of integrated components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data is set forth based upon current technology. Future developments in the art may call for appropriate adjustments as would be obvious to one skilled in the art. Also, the conductive lines in the FIGS can represent any stepped structure on a semiconductor device and are not limited in composition.

TABLE 5

| Film deposition process/film treatment parameter | Invention's "boron-contained HDP-CVD glass film" | | Prior art HDP-CVD PSG film |
| --- | --- | --- | --- |
| | Estimated range of parameters | Most preferred range of parameters | |
| Deposition wafer temperature (° C.) | 250–650 | 400–450 | 400–650 |
| Deposition pressure (millitor) | 0.5–10 | 1–5 | <5 |
| Plasma frequency (KHz) | 300–600 | 400–450 | 400–450 |
| Deposition plasma density (ions/cm$^2$) | 1 × E11–1 × E13 | 1 × E11–1 × E12 | 1 × E12–1 × E13 |
| Deposition: Etch to deposition ratio | 0.03–0.3 | 0.05–0.15 | 0.05–0.3 |
| Deposition: silicon source | Silane and its derivatives | Silane | Silane |
| Deposition: silicon source flow (sccm) | 50–500 | 100–200 | 100–200 |
| Deposition: oxygen flow rate (sccm) | 100–400 | 250–350 | 250–350 |
| Deposition: boron and phosphorus precursors | Diborane and its derivatives Phosphine and its derivatives | Diborane and its derivatives Phosphine and its derivatives | NA Phosphine |
| Deposition: boron precursor flow (sccm) | 10–150 | 20–100 | NA |
| Deposition: phosphorus precursor flow (sccm) | 10–150 | 20–100 | 50–100 |
| Deposition: carrier gas | Ar, He | Ar, He | Ar, He |
| Deposition: carrier gas flow (sccm) | 20–400 | 50–100 | 50–100 |
| As-deposited | G > 0.12 μm | G > 0.12 μm | G > 0.16 μm |

TABLE 5-continued

| Film deposition process/ film treatment parameter | Invention's "boron-contained HDP-CVD glass film" | | Prior art HDP-CVD PSG film |
|---|---|---|---|
| | Estimated range of parameters | Most preferred range of parameters | |
| gap-fill capability for structure with vertical side walls | AR < 4 | AR < 4 | AR < 3.1 |
| Silicate glass flow capability at elevated temperatures | Yes | Yes | No |
| Gap-fill after post-deposition thermal treatment at RTA, 850° C., 60 sec, nitrogen ambient | G > 0.03 $\mu$m AR < 6–8 | G > 0.03 $\mu$m AR < 6–8 | Same as as-deposited G > 0.16 $\mu$m AR < 3.1 |

While the invention has been particularly shown and described with reference to the preferred embodiments thereof, it will be understood by those skilled in the art that various changes in form and details may be made without departing from the spirit and scope of the invention.

What is claimed is:

1. A method of forming a silicate glass film over a heated substrate by High Density Plasma Chemical Vapor Deposition (HDP-CVD) using a silicon source, a boron source, a phosphorus source, and an oxygen source as essential reactants in the constant presence of a plasma, the method comprising the steps of:
   a) placing a substrate in a reactor chamber wherein said substrate has at an upper surface a plurality of steps;
   b) in a first borosilicate glass deposition step, inducing a reaction in a gaseous mixture composition to produce deposition of a borosilicate glass film over said substrate, said borosilicate glass film is deposited by subjecting said substrate to a plasma during the entire said deposition step, and wherein said composition comprises said silicon source, said oxygen source, a carrier gas, a source of boron;
   c) in a second phosphosilicate glass deposition step, inducing a reaction in a gaseous mixture composition to produce deposition of a phosphosilicate glass film over said borosilicate film, said phosphosilicate glass film is deposited by subjecting said substrate to a plasma during the entire said deposition step, and wherein said composition comprises said silicon source, said oxygen source, a carrier gas, and a source of phosphorus; and
   d) in a post deposition thermal anneal of said borosilicate and phosphosilicate glass films, said borosilicate and phosphosilicate glass films are flowed wherein a worsening of film integrity and voids in said films between said steps are avoided.

2. The method of claim 1 wherein said reaction occurs under the following conditions: a temperature of said substrate is between about 250° C. and 650° C., a process pressure is between 0.5 and 10 millitorr, frequency of energy of reaction chamber to produce said plasma is between about 300 KHz and 600 KHz, said plasma has a plasma density in the range of between about 1×E11 and 1×E13 ions/cm$^3$, said source of silicon is silane or its derivative with a flow between 50 and 500 sccm, said oxygen has a flow of between 100 and 400 sccm, said source of boron in the first deposition step is diborane or its derivative with a flow of between 10 and 150 sccm, said source of phosphorus in the second deposition step is phosphine or its derivative with a flow of between 10 and 150 sccm, and said carrier gas has a flow of between 20 and 400 sccm.

3. The method of claim 1 wherein said reaction occurs under the following conditions: a temperature of said substrate is between about 400° C. and 650° C., a process pressure is between 1 and 5 millitorr, frequency of energy of reaction chamber to produce said plasma is between about 400 KHz and 450 KHz, said plasma has a plasma density in the range of between about 1×E11 and 1×E12 ions/cm$^3$, said source of silicon is silane with a flow of between 100 and 200 sccm, said oxygen has a flow rate of between 250 and 350 sccm, said source of boron in the first deposition step is diborane with a flow of between 20 and 100 sccm, said source of phosphorus in the second deposition step is phosphine with a flow of between 20 and 100 sccm, and said carrier gas has a flow between 50 and 100 sccm.

4. The method according to claim 1 wherein prior to said first borosilicate glass deposition step, further comprising performing in-situ an oxide liner step to form an oxide liner over said substrate.

5. The method according to claim 1 wherein after said phosphosilicate glass deposition step, performing in-situ an oxide layer step to form an oxide cap layer over said phosphosilicate glass film.

6. A method of forming a silicate glass film over a heated substrate by High Density Plasma Chemical Vapor Deposition (HDP-CVD) using a silicon source, a boron source, a phosphorus source, and an oxygen source as essential reactants in the constant presence of a plasma, the method comprising the steps of:
   a) placing a substrate in a reactor chamber wherein said substrate has at an upper surface a plurality of steps;
   b) in a first borosilicate glass deposition step, inducing a reaction in a gaseous mixture composition to produce deposition of a borosilicate glass film over said substrate, said borosilicate glass film is deposited by subjecting said substrate to a plasma during the entire said deposition step, and wherein said composition comprises said silicon source, said oxygen source, a carrier gas, a source of boron;
   c) in a second borophosphosilicate glass deposition step, inducing a reaction in a gaseous mixture composition to produce deposition of a borophosphosilicate glass film over said borosilicate glass film, said borophosphosilicate glass film is deposited by subjecting said substrate to a plasma during the entire said deposition step, and wherein said composition comprises said silicon source, said oxygen source, a carrier gas, and a source of boron and a said source of phosphorus; and
   d) in a post deposition thermal anneal of said borosilicate and borophosphosilicate glass films, said borosilicate and borophosphosilicate glass films are flowed wherein worsening of film integrity and voids in said films between said steps are avoided.

7. The method of claim 6 wherein said reaction occurs under the following conditions: a temperature of said substrate is between about 250° C. and 650° C., a process pressure is between 0.5 and 10 millitorr, frequency of energy of reaction chamber to produce said plasma is between about 300 KHz and 600 KHz, said plasma has a plasma density in the range of between about 1×E11 and 1×E13 ions cm$^3$, said source of silicon is silane or its derivative with a flow between 50 and 500 sccm, said oxygen has a flow of between 100 and 400 sccm, said source of boron in the first deposition step is diborane or its derivative with a flow of between 10 and 150 sccm, said source of phosphorus in the second deposition step is phosphine or its derivative with a flow of between 10 and 150 sccm, and said carrier gas has a flow of between 20 and 400 sccm.

8. The method of claim 6 wherein said reaction occurs under the following conditions: a temperature of said substrate is between about 400° C. and 650° C., a process pressure is between 1 and 5 millitorr, frequency of energy of reaction chamber to produce said plasma is between about 400 KHz and 450 KHz, said plasma has a plasma density in the range of between about $1 \times E11$ and $1 \times E12$ ions/cm$^3$, said source of silicon is silane with a flow of between 100 and 200 sccm, said oxygen has a flow rate of between 250 and 350 sccm, said source of boron in the first deposition step is diborane with a flow of between 20 and 100 sccm, said source of phosphorus in the second deposition step is phosphine with a flow of between 20 and 100 sccm, and said carrier gas has a flow between 50 and 100 sccm.

9. The method according to claim 6 wherein prior to said first borosilicate deposition step, further comprising performing in-situ an oxide liner step to form an oxide liner over said substrate.

10. The method according to claim 6 wherein after said second borophosphosilicate deposition step, performing in-situ an oxide layer step to form an oxide cap layer over said borophosphosilicate glass film.

* * * * *